US011955426B2

(12) United States Patent
Do et al.

(10) Patent No.: US 11,955,426 B2
(45) Date of Patent: Apr. 9, 2024

(54) PACKAGE-INTEGRATED MULTI-TURN COIL EMBEDDED IN A PACKAGE MAGNETIC CORE

(71) Applicant: INTEL CORPORATION, Santa Clara, CA (US)

(72) Inventors: Huong Do, Chandler, AZ (US); Kaladhar Radhakrishnan, Chandler, AZ (US); Krishna Bharath, Chandler, AZ (US); Yikang Deng, Chandler, AZ (US); Amruthavalli P. Alur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/839,337

(22) Filed: Jun. 13, 2022

(65) Prior Publication Data
US 2022/0310512 A1    Sep. 29, 2022

Related U.S. Application Data

(63) Continuation of application No. 16/107,757, filed on Aug. 21, 2018, now Pat. No. 11,393,751.

(51) Int. Cl.
*H01L 23/522* (2006.01)
*H01L 21/768* (2006.01)
*H01L 23/66* (2006.01)
*H01L 49/02* (2006.01)

(52) U.S. Cl.
CPC .... *H01L 23/5227* (2013.01); *H01L 21/76816* (2013.01); *H01L 23/5226* (2013.01); *H01L 23/66* (2013.01); *H01L 28/10* (2013.01); *H01L 2223/6672* (2013.01)

(58) Field of Classification Search
CPC .......... H01L 23/5227; H01L 21/76816; H01L 23/5226; H01L 23/66; H01L 28/10; H01L 2223/6672; H01L 23/6672
USPC ........................................... 257/531; 438/132
See application file for complete search history.

(56) References Cited

U.S. PATENT DOCUMENTS

2015/0137932 A1    5/2015  Chen
2017/0271260 A1*   9/2017  Wojnowki et al. ..........
                                                        H01L 23/5227

OTHER PUBLICATIONS

Notice of Allowance for U.S. Appl. No. 16/107,757, dated Mar. 16, 2022.
Restriction Requirement for U.S. Appl. No. 16/107,757, dated Oct. 29, 2021.

* cited by examiner

*Primary Examiner* — Thinh T Nguyen
(74) *Attorney, Agent, or Firm* — Essential Patents Group, LLP

(57) ABSTRACT

A microelectronics package comprising a substrate, the substrate comprising a dielectric and at least first and second conductor level within the dielectric, where the first and second conductor levels are separated by at least one dielectric layer. The microelectronics package comprises an inductor structure that comprises a magnetic core. The magnetic core is at least partially embedded within the dielectric. The inductor structure comprises a first trace in the first conductor level, a second trace in the second conductor level, and a via interconnect connecting the first and second traces. The first trace and the second trace extend at least partially within the magnetic core.

15 Claims, 11 Drawing Sheets

PACKAGE-INTEGRATED MULTI-TURN COIL EMBEDDED IN A PACKAGE MAGNETIC CORE

CLAIM FOR PRIORITY

This application is a continuation of, and claims the benefit of priority to U.S. patent application Ser. No. 16/107,757, filed on Aug. 21, 2018, titled "PACKAGE-INTEGRATED MULTI-TURN COIL EMBEDDED IN A PACKAGE MAGNETIC CORE", and which is incorporated by reference in its entirety for all purposes.

BACKGROUND

Integrated voltage regulator (IVR) technology is an efficient die and package architecture for managing disparate voltages required by the various functions encompassed by a microprocessor, or other integrated circuitry. Currently, IVR implementations in microprocessor packages, such as fully-integrated voltage regulator (FIVR) topologies, rely on air-core inductors. Typically, the air-core inductors are off-die, either on, or embedded within, the package dielectric adjacent to the microprocessor die. Chip manufacturers are continuing to reduce package footprint with succeeding microprocessor generations. Z-height constraints imposed by thin package architecture reduces vertical space for the embedded inductor as well. Copper trace thicknesses within a package are generally limited to 25 microns or less. Consequently, the dc (direct current) resistance of the copper traces comprised by the embedded inductors increases from generation to generation, which erodes the inductor quality factor (ratio of energy stored in the inductor's magnetic field to energy dissipated by resistive losses in the inductor windings). As a consequence, the overall efficiency of IVRs suffer as losses increase.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
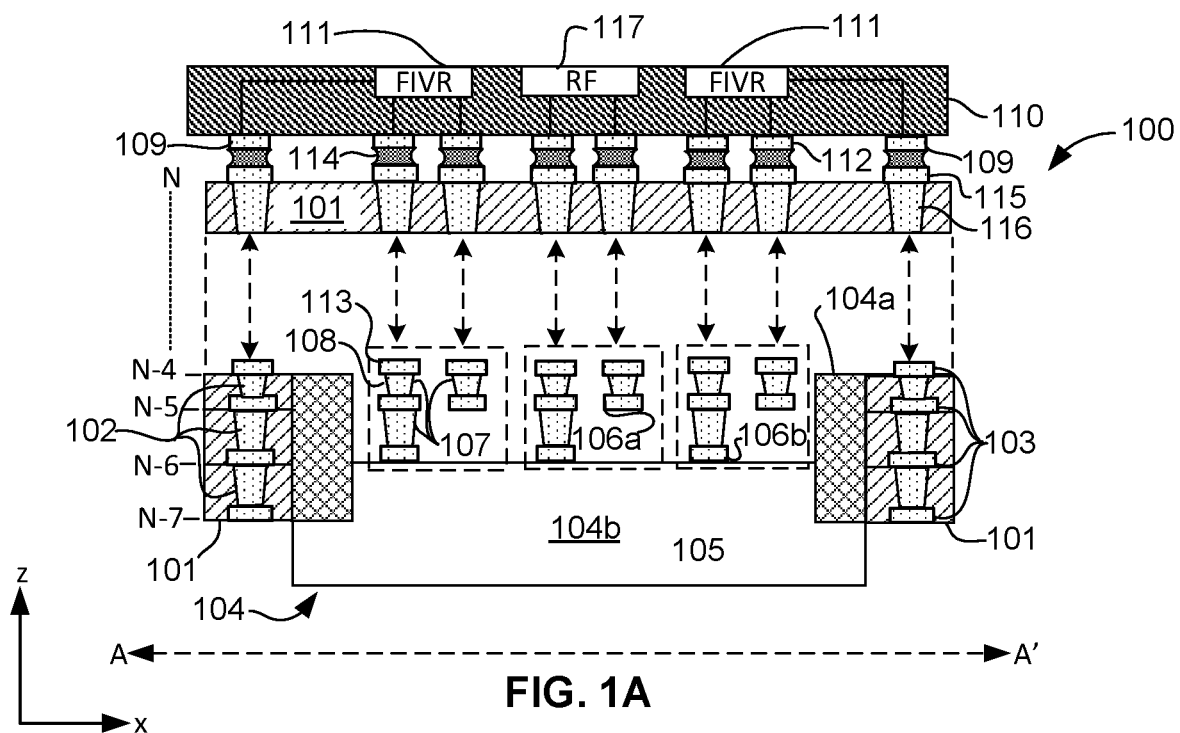
FIG. 1A illustrates a cross-sectional view in the x-z plane of an integrated circuit (IC) package substrate showing multiple multi-turn inductors, according to embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Integrated voltage regulators (IVRs), such as fully-integrated voltage regulators (FIVRs), comprise voltage regulation circuitry that is integrated on an IC die, such as, but not limited to, a microprocessor die. On-die voltage regulation provides several advantages over previous generation off-die schemes such as motherboard-based voltage regulator modules. In general, response to rapidly changing power states and loads is greatly improved by point-of-load regulation as the reactive latency is reduced by a factor of up to 1000. The improvement is beneficial to the IC performance. In the examples of a microprocessor, performance for both core and peripheral functions may be improved. With a conventional FIVR, power management may display maximum voltage transition times of hundreds of nanoseconds, whereas transition times for prior generation voltage regulator modules are characteristically hundreds of microseconds. As a result, graphics processing speed may be doubled with FIVR power management. Additionally, battery life may be extended by more than 50%.

At least one FIVR may be coupled to each power rail of IC device (e.g., microprocessor). One IVR topology based on multiphase buck converters may employ air-core inductors, which can be directly integrated into the microprocessor package substrate. Air core inductors, which require a large footprint as they are typically two-dimensional coils (e.g., planar spiral "pancake" inductors) are a hindrance to further reducing package dimensions. Package architectures for integrated air core inductors generally require thick package cores (a structural component of the substrate, not to be confused with a magnetic core for an inductor). For example, a typical thick package core z-height is around 400 microns. Other solutions include discrete magnetic core inductors (MCI) that are typically attached on the land side of a package substrate. Effective MCI inductors have large z-heights that may almost double the overall package thickness. These constraints on package thickness may be relieved, at least in part, by incorporating inductive components that do not require additional package layers or thick discrete devices attached to the substrate.

Embodiments disclosed herein may incorporate into the package an inductive component having a large inductance density, while maintaining a low z-height of the substrate. Embodiments disclosed herein comprise one or more multi-turn inductors embedded within a magnetic core. The magnetic core may be embedded within a multilayer package substrate dielectric. To maintain small footprint and z-height dimensions, inductors are formed as conductor traces within the embedded conductor layers. The conductor traces may have thickness ranging from 15 microns to 35 microns, for example.

In some embodiments, a multi-turn inductor architecture comprises two or more parallel inductor windings formed within two different conductor levels within an IC package substrate. The inductor windings may be conductor traces interconnected in electrical series by a conductive via at one end of each trace. A package-integrated solenoid coil may include two or more parallel traces, in alternating conductive levels, and connected in electrical series. In some embodiments, the inductor windings are two vertically-spaced tandem traces formed within different conductor levels. The interconnected inductor traces extend through a magnetic core embedded within the dielectric of an IC package substrate. In some embodiments, the tandem inductor traces are laterally spaced to avoid or mitigate any negative coupling of magnetic fields associated with currents running counter to each other through the interconnected inductor traces.

In addition to voltage regulation, the disclosed integrated multi-turn inductor may be incorporated as an inductive component into a radio frequency (re oscillator circuit, a rf phasing circuit or a rf mixing circuit.

A full description of the disclosed integrated multi-turn inductor follows the definition of terms given in the subsequent paragraphs. Throughout the specification, and in the claims, the following terms are used and defined in the following paragraphs.

Here, the term "connected" or "interconnected" means a direct connection, such as electrical, mechanical, or magnetic connection between the things that are connected, without any intermediary devices.

Here, the term "coupled" means a direct or indirect connection, such as a direct electrical, mechanical, or magnetic connection between the things that are connected or an indirect connection, through one or more passive or active intermediary devices.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "substrate" refers to the substrate of an IC package. The package substrate is generally coupled to the die or dies contained within the package, where the substrate comprises a dielectric having conductive structures on or embedded with the dielectric. Throughout this specification, the term "package substrate" is used to refer to the substrate of an IC package.

Here, the term "magnetic core" generally refers to a body of magnetic or magnetizable material that provides a region of low reluctance for magnetic flux. In this disclosure, a magnetic core is part of an inductor. The magnetic core encloses inductor windings to increase self-inductance of the inductor. The term "inductor core" may also be used in the same context. It is distinguished from the term "core" or "package core", which generally refers to a stiffening layer generally embedded within of the package substrate, or comprising the base of a package substrate.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified).

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view in the x-z plane of Integrated Circuit (IC) package substrate 100 showing multiple multi-turn inductors 105, according to embodiments of the disclosure. In some embodiments, multi-turn inductors 105 are inductive components of IVR circuitry that may be on board a microprocessor die (not shown) attached to Package substrate 100.

In FIG. 1A, a section of integrated circuit (IC) package substrate 100 is shown. In some embodiments, package substrate 100 comprises a series of build-up film laminates composing package dielectric 101. Multiple film layers comprising a suitable package dielectric material may be laminated over a package core as a stack of package dielectric laminates. In cored packages, the core is a permanent component of the substrate. For coreless packages, a core is absent from the laminated stack of the substrate. Over each dielectric film layer, there are conductive structures such as pads/traces 103. An example is a package substrate formed by bumpless build-up layer (BBUL) methodology. The term "bumpless" refers to dielectric layers of substrate and components and conductive structures embedded within the dielectric layers, where no solder balls or bumps are used as means of attachment.

In some embodiments, package dielectric 101 comprises composite epoxies, crystalline polymers, polyamides or polyimides. Other suitable package dielectric materials may be used. In some embodiments, package dielectric 101 comprises dielectric film laminate layers having thicknesses ranging from 20 to 40 microns. In some embodiments, all layers have the same thickness. In some embodiments, dielectric film laminate layers may have different thicknesses.

Signal and power routing within conductive levels N−7 through N−4 are interconnected by signal vias 102. Signal vias 102 and pads/traces 103 are embedded within package dielectric 101, with pads/traces 103 within conductor levels N−4 through N−7 of, for example, a package substrate that has seven conductor levels. In the illustrated embodiment, the land-side conductor level is denoted by level N−7. In general, the conductor level indicia (e.g., N−7) are referenced to level N, the upper-most or die-side conductor level of package substrate 100. In some embodiments, conductor level N is at the die side surface of package substrate 100.

In the illustrated embodiment of FIG. 1A, three individual multi-turn inductors 105 are delineated by the dashed rectangles to show vertically-spaced and laterally-spaced upper inductor winding portion 106a and lower inductor winding portion 106b (collectively referenced as inductor windings 106) and via interconnects 107 that interconnect inductor windings 106 to pads/traces 103 in adjacent conductor levels. Pads/traces 103 are generally tied to higher or lower conductor levels within package substrate 100 by signal vias 102. The interconnecting vias 102 that are coupled to multi-turn inductors 105 through via interconnects 107 are not shown in the figure for clarity. It is understood that multi-turn inductors 105 are coupled to circuitry, such as IVR circuits on a microprocessor chip (or other type of IC) attached to the die side of package substrate 100. In some embodiments, inductor windings 106 are substantially parallel. Three multi-turn inductors 105 are shown in FIG. 1A, but any number of inductors may be incorporated into package substrate 100. The cross-sectional view of FIG. 1A is taken along cut line A-A' in FIG. 1B. The plan view of FIG. 1B better illustrates connections of the inductor windings.

In some embodiments, multi-turn inductors 105 extend along the y-direction through magnetic core block 104. First portion 104a of magnetic core block 104 is removed in FIG. 1B to permit the plan view of inductor windings 106. This is reflected in the cross-sectional view of FIG. 1A, which is rotated 90 degrees from the plan view in FIG. 1B. In FIG. 1A. multi-turn inductors 105 appear to be suspended above magnetic core material, but it is to be understood that multi-turn inductors 105 are embedded in the magnetic core.

In some embodiments, multi-turn inductors 105 comprise via interconnects 107 in a stacked configuration. Via interconnects 107 couple both upper winding 106a and lower winding 106b to pads/traces 113 in conductive level N−4. Pads/traces 113 may provide lateral interconnections to conductive structures within conductive level N−4, or couple to via interconnects to upper conductive level N−3. Routing in conductor level N−4 external to the magnetic core block 104 conduct signals to or from multi-turn inductors 105. In the illustrated embodiment shown in FIG. 1A, multi-turn inductors 105 are independent as they are not coupled directly to each other. As an example, the three independent multi-turn inductors 105 are each coupled to a single multi-phase buck converter IVR. In some embodiments, multiple multi-turn inductors 105 are connected in electrical parallel or series to increase inductance density.

In some embodiments, inductor windings 106 are conductive traces within adjacent conductor levels (e.g., upper inductor winding portion 106a in level N−5 and lower inductor winding portion 106b in level N−6, as shown). In some embodiments, inductor windings 106 are conductive traces within non-adjacent conductor levels (e.g., upper inductor winding portion 106a in level N−4 and lower inductor winding portion 106b in level N−6) In some embodiments, inductor windings 106 have thicknesses ranging from 15 microns to 35 microns. Thicker windings are capable of conducting large currents. As an example, currents may be tens of amperes, in some instances reaching 30 amperes or greater coursing through an individual winding.

Inductor windings 106 require corresponding cross-sectional areas to safely conduct large currents without overheating to temperatures that may damage the package materials and components and melt or otherwise damage the windings. As an example, land-side contacts at conductor level N−7 may be coupled to a 1.8-volt output of a voltage regulator module on the motherboard. Power rails 109 of die 110 attached to die-side contacts (e.g., conductor level N, not shown) on package substrate 100 may be fed power that is transferred by vias 102. FIVR circuits 111 on die 110 are coupled to power rails 109. FIVR circuits 111 are also coupled to multi-turn inductors 105 through die bondpads 112, solder joints 114 and substrate die-side pads 115 in conductive level N. Substrate die-side pads 115 are over the upper-most layer of dielectric 101. As shown in FIG. 1A, substrate die-side pads 115 are subtended by vias 116 extending through the uppermost layer of dielectric 101 for vertical interconnection to conductive structures in conductive level N−1 (not shown). Dashed double arrows below vias 116 indicate coupling to bondpads 113 in conductive level N−4 of package substrate 100. Currents moving through multi-turn inductors 105 may be as high as 30 amperes. To conduct 30 amperes, inductor windings 106 may require a minimum cross-sectional area equivalent to an AWG (American Wire Gauge) No. 10 wire, which has a diameter of 2.5 mm Correspondingly, via interconnects 107 may be sized to handle large currents. In some embodiments, small dimensions of inductor windings 106 and via interconnects 107 are maintained by distributing large currents among several multi-turn inductors 105 that are coupled in electrical parallel to the current source. In some embodiments, radio frequency (RF) circuits are coupled to integrated inductors 105. This is shown in FIG. 1A, where RF circuit 117 on die 110 is coupled to the multi-turn inductor 105. In some embodiments, RF circuit 117 may include, but not be limited to, a radio frequency oscillator, a radio frequency phasing circuit or a radio frequency mixing circuit.

Package substrate 100 further comprises magnetic core block 104. In some embodiments, magnetic core block 104 is divided into first portion 104a that is embedded within package dielectric 101, and second portion 104b that extends over the land side of package substrate 100. In some embodiments, first portion 104a and second portion 104b comprise substantially the same magnetic material, being a single domain comprising a single magnetic material. In some embodiments, first portion 104a and second portion 104b comprise different magnetic materials. The separation of magnetic core block 104 into two portions 104a and 104b is related to the method of fabrication, where first portion 104a is deposited as a paste or fill material, and second portion 104b is deposited as an ink. A more extensive explanation is given below in the description relating to the method of manufacture.

In some embodiments, first portion 104a and second portion 104b of magnetic core 104 comprise composite of magnetic particles within a neutral (non-magnetic, non-conductive) matrix. In some embodiments, the matrix is a thermoplastic or thermosetting organic polymer comprising epoxy resins, polyamide resins, polyimide resins, polysulfones. Inorganic materials such as silica filler, silicates, may also be included.

Suitable magnetic materials include, but are not limited to, any of iron, nickel, nickel-iron alloys such as Mu metals and/or permalloys. In some embodiments, magnetic materials comprise lanthanide and/or actinide elements. In some embodiments, magnetic core block 104 comprises cobalt-zirconium-tantalum alloy (e.g., CZT). Suitable magnetic materials may also comprise semiconducting or semi-metallic Heusler compounds and non-conducting (ceramic) ferrites. In some embodiments, ferrite materials comprise any of nickel, manganese, zinc, and/or cobalt cations, in addition to iron. In some embodiments, ferrite materials comprise barium and/or strontium cations. Heusler compounds may comprise any of manganese, iron, cobalt, molybdenum, nickel, copper, vanadium, indium, aluminum, gallium, silicon, germanium, tin, and/or antimony. Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, Cu2MnAl, Cu2MnIn, Cu2MnSn, Ni2MnAl, Ni2MnIn, Ni2MnSn, Ni2MnSb, Ni2MnGa Co2MnAl, Co2MnSi, Co2MnGa, Co2MnGe, Pd2MnAl, Pd2MnIn, Pd2MnSn, Pd2MnSb, Co2FeSi, Co2FeAl, Fe2VAl, Mn2VGa, Co2FeGe, MnGa, MnGaRu, or Mn3X, where 'X' is one of Ga or Ge.

Materials such as Pt, Pd, W, Ce, Al, Li, Mg, Na, Cr2O3, CoO, Dy, Dy2O, Er, Er2O3, Eu, Eu2O3, Gd, Gd2O3, FeO, Fe2O3, Nd, Nd2O3, KO2, Pr, Sm, Sm2O3, Tb, Tb2O3, Tm, Tm2O3, V, V2O3 or epoxy material with particles of a magnetic alloy. A magnetic alloy can be an alloy formed of one or more of: Pt, Pd, W, Ce, Al, Li, Mg, Na, Cr, Co, Dy, Er, Eu, Gd, Fe, Nd, K, Pr, Sm, Tb, Tm, or V.

While some of the magnetic materials are conductors, it is understood that the composite is electrically non-conductive to avoid short-circuiting pads/traces 103 and windings 106 within the same conductor level and between adjacent conductor levels.

Figure 1B:
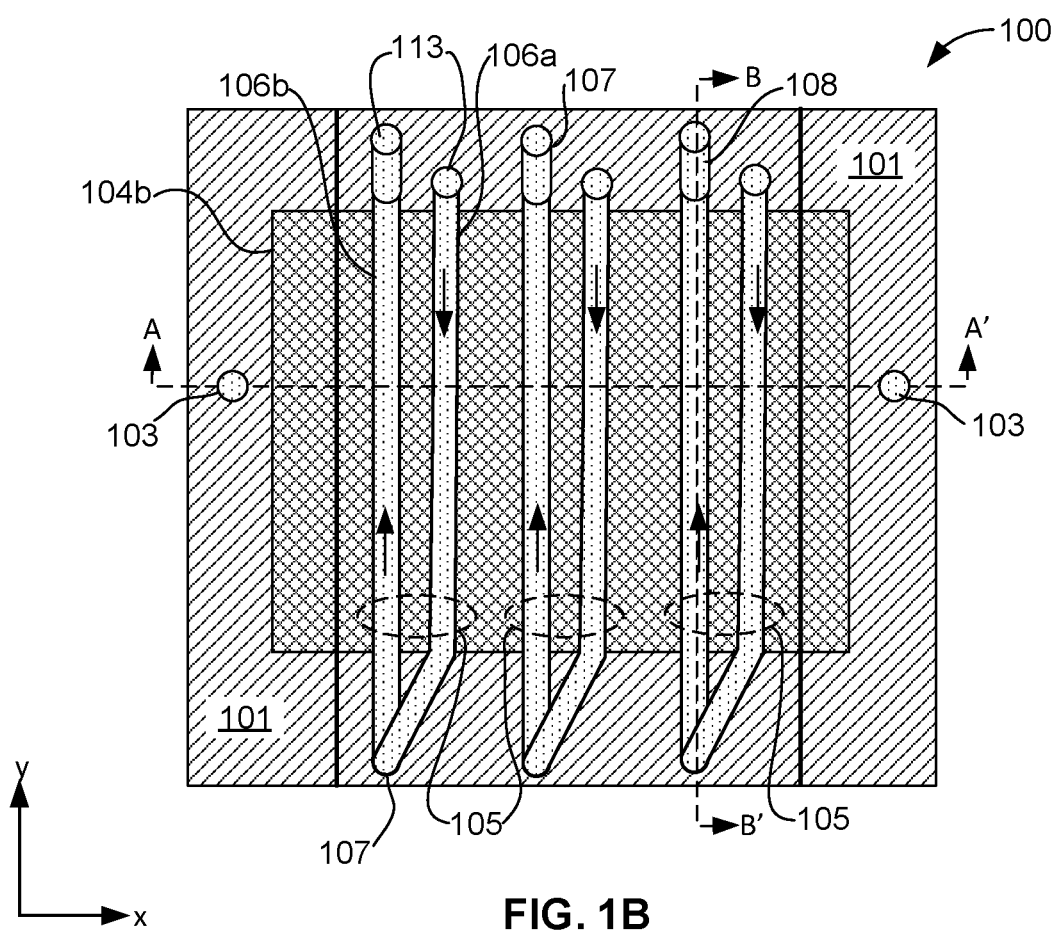
FIG. 1B illustrates a cut-away plan view in the x-y plane of a package substrate showing multiple multi-turn inductors, according to embodiments of the disclosure.

FIG. 1B illustrates a cut-away plan view in the x-y plane of package substrate 100 showing multiple multi-turn inductors 105, according to embodiments of the disclosure.

The plan view in the x-y plane shown in FIG. 1B is taken from above package substrate 100. The heavy vertical lines on the left and right sides indicate vertical edges of the cut-away view shown in FIG. 1A. Between the vertical lines, a portion of package dielectric material 101 and magnetic core block 104 have been removed to expose multi-turn inductors 105, each comprising the two winding portions 106a, 106b that may also be referred to as lower and upper turns, respectively. Below the level of multi-turn inductors 105 is second portion 104b of magnetic core block, surrounded by IC package dielectric 101.

In some embodiments, upper winding portion 106a is spaced laterally apart from lower winding portion 106b. The lateral spacing may minimize negative magnetic coupling between windings 106. Arrows indicate an example of current direction. The particular direction of current flow is arbitrary and do not indicate a particular embodiment, but show that currents flow in opposing directions along upper and lower windings 106 in each multi-turn inductor 105. It is understood that the current is generally a pulsed direct current (dc), which flows in a single direction. While the current is pulsed dc, the frequency (Fourier) spectrum comprises a pure dc component in addition to fundamental and harmonic alternating current (ac) components.

For clarity, the arrows indicate current flow during the pulse portion of the switching duty cycle. As an example, pulsed current is output at a frequency of 140 MHz, and flows into any one or each of the three multi-turn inductors 105 shown in FIG. 1B. In some embodiments, multi-turn inductors 105 are coupled to switching transistor pairs in the IVR circuitry (e.g., FIVR circuits 111 on die 110, FIG. 1A). Current enters multi-turn inductors 105 from the current source and flows along the upper winding 106a, then along lower winding 106b, returning to the current sink by exiting lower windings 106b through via interconnects 107. In some embodiments, the current source and sink is a FIVR circuit (e.g., FIVR circuit 111) on board an IC die (e.g., die 110, FIG. 1A) attached to package substrate 100. Load shunt capacitance in the FIVR circuitry may be coupled to one or more multi-turn inductors 105, and together with the one or more multi-turn inductors 105, filters the current to reduce the pulses to a relatively low value of ripple (e.g., 20%) superimposed on a pure dc component.

The amount of ripple voltage or current may be reduced to a suitable predetermined level through selection of the value of self-inductance of multi-turn inductors 105, and shunt capacitance values. A counter or buck voltage may be generated at both ends of multi-turn inductors 105 that is somewhat smoothed, and reduces the output voltage of the IVR or FIVR (e.g., FIVR 111). For a given frequency, the magnitude of the buck voltage and the suppression of ripple are functions of inductance density within the magnetic core. Multi-turn inductors 105 increase the inductance density over a single turn inductor within the same volume of magnetic core.

Flux coupling between winding pairs comprising upper and lower windings 106a and 106b, respectively, is negative due to the proximity of the windings in the pair. Negative coupling is mitigated to a degree by distancing the windings as far as is practicable. While negative magnetic coupling decreases mutual inductance and inductive density, connecting two windings 106 in series increases the length of multi-turn inductor 105 by approximately a factor of two, which nominally doubles the self-inductance. In practice, subtracting the negative mutual inductance, a multi-turn inductor 105 may exhibit an increase in self-inductance over a single winding by a factor ranging between 50 and 100% for a given core permeability.

In some embodiments, the IVR (e.g., FIVR 111) is a multiphase system requiring more than one inductive component to be coupled to phased switches. To accommodate a multiphase IVR topology, multiple multi-turn inductors 105 are within a single magnetic core block 104, as shown in the illustrated embodiment. Mutual inductance between all upper windings 106a is positive in adjacent inductors. Mutual inductance between all lower windings 106b in adjacent inductors is positive, as current direction is the same in all upper windings 106a and is the same in all lower windings 106b. Enhancement of mutual inductance by multiple adjacent multi-turn inductors 105 increases overall inductive density, further increasing the overall inductance of each multi-turn inductor 105.

Where upper winding 106a and lower winding 106b overlap at the bottom portion of FIG. 1B, via interconnects 107 couple them together. In the top portion of FIG. 1B, via interconnects 107 couple winding 106 to higher conductor levels (e.g., to conductor level N−5 in FIG. 1A). In the illustrated embodiment, short trace 108 is within conductor level N−5. Short trace 108 couples to lower trace 106b by a first via interconnect 107 (see FIG. 1A) at a first end, and to a second via interconnect 107 at a second end. Pads/traces 103 coupled to via interconnects 107 in the top portion of FIG. 1B are within conductor level N−4 (see FIG. 1A).

Figure 1C:
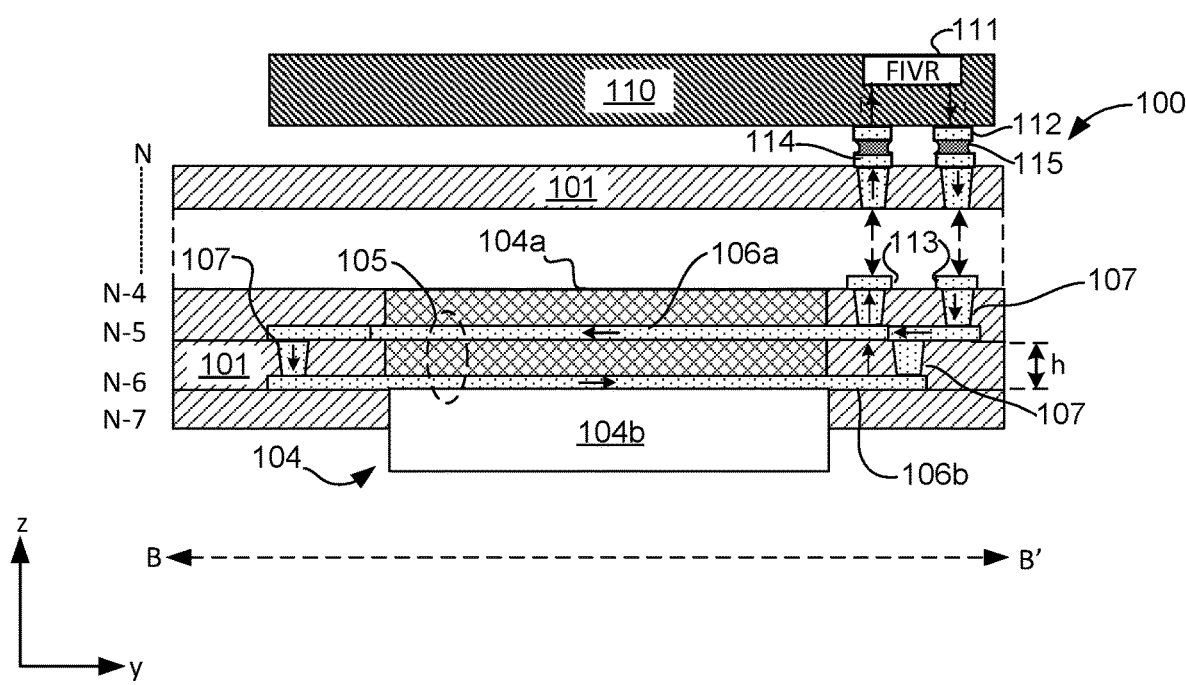
FIG. 1C illustrates a cross-sectional view in the y-z plane of a package substrate showing a side view of multi-turn inductors, according to some embodiments of the disclosure.

FIG. 1C illustrates a cross-sectional view in the y-z plane of package substrate 100 showing a side view of multi-turn inductors 105, according to some embodiments of the disclosure.

The cross sectional view of FIG. 1C is taken from cut B-B' in FIG. 1B. A single multi-turn inductor 105 is shown, having two windings (turns). In some embodiments, upper winding 106a and lower winding 106b extend through magnetic core block portion 104a, and into package dielectric 101. Via interconnects 107 are within package dielectric 101, allowing signal-carrying routing to remain outside of magnetic core block 104. Vertical separation between each winding is minimally equivalent to the thickness of a package dielectric film layer, which determines the distance between conductor layers (e.g., the vertical separation between conductor layers N−6 and N−5).

Multi-turn inductors 105 extend along the length of magnetic core block 104 in the y-direction. Multi-turn inductors 105 have an inter-level z-spacing between windings 106 that is at least the indicated vertical distance h between conductor levels N−6 and N−5. In some embodiments, h is substantially equal to the thickness of a layer of package dielectric laminate films. In some embodiments, h is equivalent to the combined thickness of two or more package dielectric laminate films.

Arrows indicate an example of current flow in multi-turn inductors 105. In some embodiments, multi-turn inductors 105 are coupled to pads/traces 113 in conductor layer N−4 by vias (e.g., via interconnects 107). Pads/traces 113 may couple to higher conducive levels (e.g. conductive levels N−3 to N, not shown), eventually reaching highest level conductor level N on the die-side of package substrate 100.

Figure 2A:
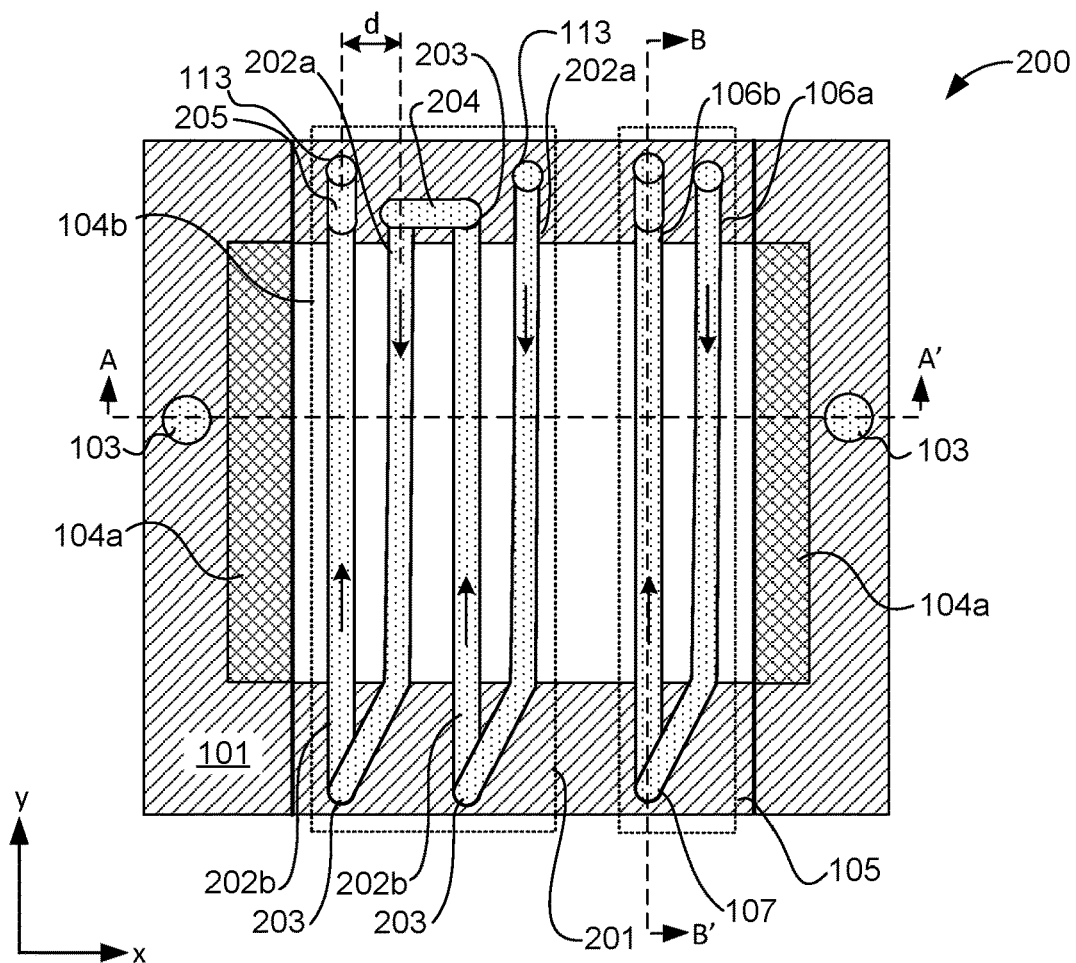
FIG. 2A illustrates a plan view in the x-y plane of a package substrate, according to some embodiments of the disclosure.

FIG. 2A illustrates a plan view in the x-y plane of package substrate 200, according to some embodiments of the disclosure.

In FIG. 2A, a portion of Package substrate 200 is shown in cut-away plan view to reveal the embedded multi-turn inductors 105 and 201. The plan view is taken above Package substrate 200 to show the details of multi-turn inductor 201. In the illustrated embodiments, multi-turn inductor 201 has four windings, and those of adjacent multi-turn inductor 105, having two windings. It is understood that other embodiments of multi-turn inductor 201 may comprise fewer than four windings, or more than four windings. In other embodiments, multi-turn inductor 105 may comprise more than two windings. The multi-turn inductors 105 and 201 are delineated by the dashed rectangles. The architecture of multi-turn inductor 201 is similar to that of multi-turn inductor 105. In some embodiments, the windings of multi-turn inductors 105 and 201 are traces in alternate conductor layers.

In some embodiments, the four windings of multi-turn inductor 201 comprise two upper windings 202a, each coupled to lower windings 202b. Collectively, the four windings are referenced as windings 202. In some embodiments, upper windings 202a are within a conductor level that is adjacent to the conductor level of lower windings 202b. In some embodiments, multi-turn inductor 201 comprises two two-winding multi-turn inductors 105 coupled in series by bridge trace 204.

Figure 2B:
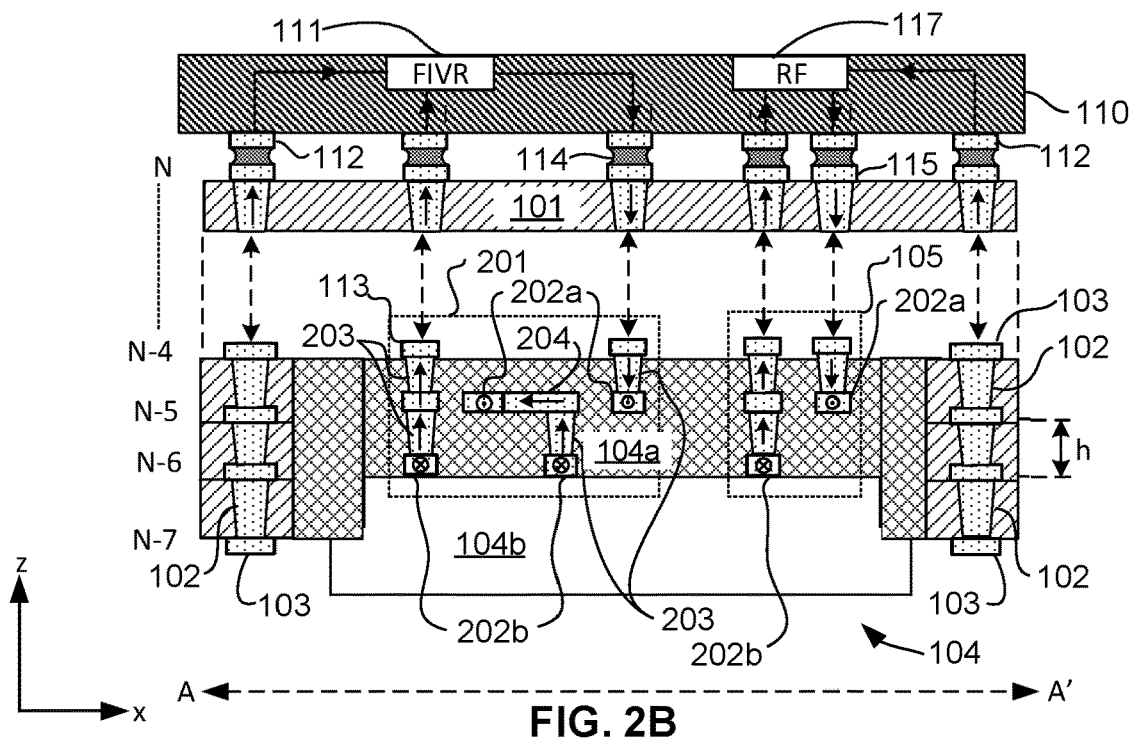
FIG. 2B illustrates a cross-sectional view in the x-z plane of a package substrate, according to some embodiments of the disclosure.

In some embodiments, upper windings 202a are coupled to lower windings 202b" by via interconnect 203. The arrows show an exemplary current flow. Current is shown to flow from right to left, along upper winding 202a. Current may flow in a first direction along a first upper winding 202a, then in an opposing direction along a first lower winding 202b. The first lower winding 202b is coupled to the first upper winding 202a through a via interconnect 203 that is vertically interconnected to a bridge trace 204. In some embodiments, bridge trace 204 is in the same conductor level as upper windings 202a. The vertical configuration of multi-turn inductor 201 is shown in FIG. 2B. Current may flow through via interconnect 203 and bridge trace 204 into a second upper winding 202a. Current flows into a second lower winding 202b that is vertically coupled to the second upper winding 202a through another via interconnect 203, to the terminal end of the second lower winding 202b that extends out of magnetic core block 104 and into package dielectric 101. Current enters short trace 205 that is vertically coupled to left-most winding 202b. Current may exit multi-turn inductor 201 through pads/traces 103.

Current flow is also shown by arrows for the adjacent two-winding multi-turn inductors 105. The current flow pattern is substantially the same as that described for multi-turn inductors 105 shown in FIGS. 1A-1C. The length and therefore the inductance of multi-turn inductor 201 is approximately twice the inductance of multi-turn inductor 105. Due to the proximity of windings conducting current in opposing directions, some negative magnetic coupling may occur during operation, subtracting from the geometric inductance that is a function of the inductor dimensions (in particular, the length), and the relative magnetic permeability of the magnetic core. Multi-turn inductors 201 and 105 are constructed in a similar manner to solenoid coils. In some embodiments, multi-turn inductor 201 may comprise an arbitrary number of windings that are coupled in series to increase inductance density beyond that of the four turns shown in FIG. 2A.

Lateral displacement of upper and lower windings 202 may range from zero (total overlap) to an arbitrary x-spacing d. In some embodiments, x-spacing d may be adjusted to minimize negative magnetic coupling between two upper windings 202a on either side of any one of the adjacent lower windings 202b.

FIG. 2B illustrates a cross-sectional view in the x-z plane of package substrate 200, according to some embodiments of the disclosure.

In FIG. 2B, the cross-sectional view is taken along cut line A-A' in FIG. 2A. The cross-sectional view depicts the vertical configuration of windings 202 and via interconnects 203 of multi-turn inductor 201. The vertical configuration of multi-turn inductor 105 is described in greater detail above (refer to FIG. 1A). Conductor levels are denoted by N−7 through N−4, where N−7 is on the land side of package substrate 200. In some embodiments, package substrate 200 comprises higher conductor levels (e.g., conductor levels N−3 through N, where level N is the top-most conductor level on the die side of the package substrate). Signal vias 102 and pads/traces 103 are shown in portions of package substrate 200 that are outside of magnetic core block 104 to distinguish these from via interconnects 203. In some embodiments, signal vias 102 convey power from a voltage regulator module on a motherboard to a microprocessor die attached to package substrate 200.

In some embodiments, upper and lower windings 202 are displaced by the z-spacing h. In some embodiments, h corresponds to the z-spacing between adjacent conductor levels. In some embodiments, h corresponds to the z-spacing between non-adjacent conductor levels. More precisely, upper and lower windings 202 may be displaced in z by more than one conductor level, according to some embodiments. In some embodiments, the z-displacement of conductor levels ranges from the thickness of a single dielectric film layer, which is between 20 and 60 microns, to the thickness of two or more dielectric film layers. The amount of z-displacement (e.g., z-spacing h) may be adjusted to minimize negative magnetic coupling between adjacent upper and lower windings 202.

An example of current flow in the multi-turn inductors 201 and 105 are indicated by arrows. In the illustrated embodiment, current flow into and out of the plane of the figure in the x-y plane is shown by end-on views of arrows within the x-y plane, shown as circles circumscribing a dot or an x in windings 202 running in the x-y plane. The circumscribed dot indicates an arrow head, pointing above the plane of the figure. The circumscribed x indicates an arrow tail, pointing below the plane of the figure. Current enters multi-turn inductor 201 by right-most pad/trace 103. Current is carried vertically (in the z-direction) between windings 202 by via interconnects 203 and exits through left-most pad/trace 113. In some embodiments, pads/traces 103 are coupled to higher conductor levels (e.g., N−3 and above) by vias (e.g., vias similar to signal vias 102) to couple multi-turn inductor 201 to FIVR circuit 111 on die 110 attached to package substrate 200. In some embodiments, die 110 is a microprocessor die. In some embodiments, die 110 comprises RF circuit 117, where RF circuit is coupled to integrated inductor 105. In some embodiments, RF circuit 117 may include, but not be limited to, a RF oscillator circuit, a RF phasing circuit or a RF mixing circuit.

In some embodiments, magnetic core block 104 comprises a first portion 104a embedded within package dielectric 101, and a second portion 104b overlaying first portion 104a. In some embodiments, first portion 104a and second portion 104b comprise substantially the same magnetic material. In some embodiments, first portion 104a comprises a magnetic material that is substantially different from the magnetic material comprised by second portion 104b. In embodiments where the compositions differ, the magnetic particles may be the same. The dielectric matrix may be different for reasons concerning the manufacturing process, described in greater detail below.

Figure 2C:
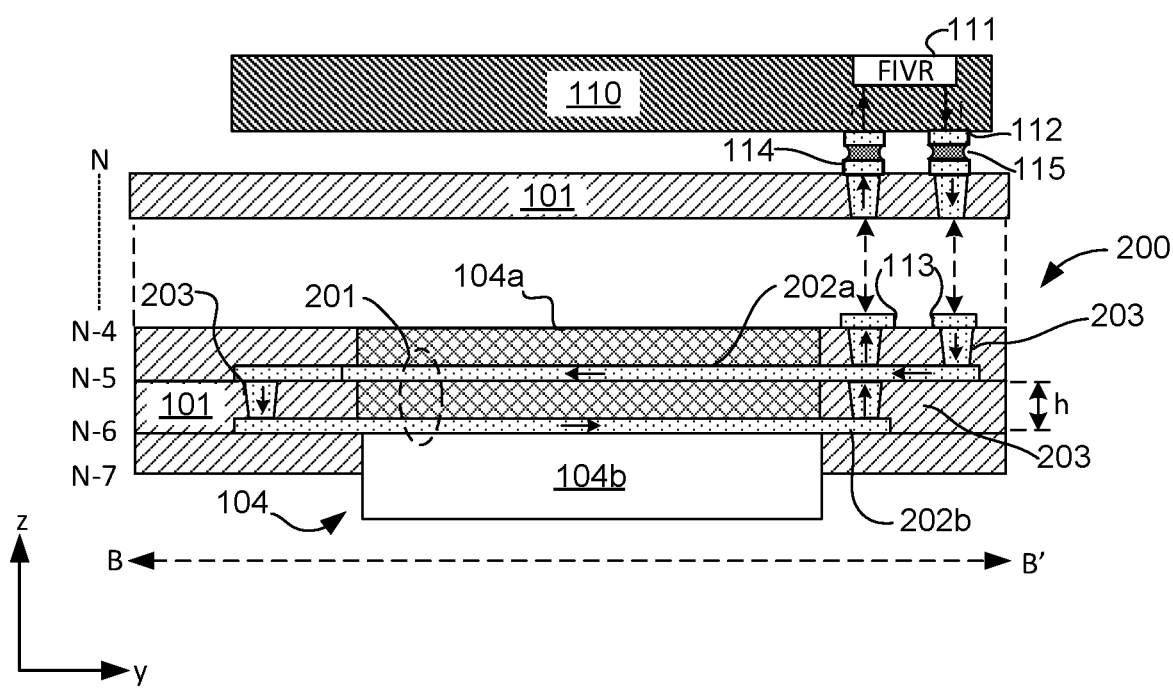
FIG. 2C illustrates a cross-sectional view in the y-z plane of a package substrate showing a side view of a multi-turn inductor, according to some embodiments of the disclosure.

FIG. 2C illustrates a cross-sectional view in the y-z plane of package substrate 200 showing a side view of multi-turn inductor 201, according to some embodiments of the disclosure.

The cross sectional view of FIG. 2C is taken from cut B-B' in FIG. 2A, and is rotated 90° from the cross-sectional view of FIG. 2B. Multi-turn inductor 201 (or 105) is shown in profile. In the profile view, one winding pair, comprising an upper winding 202a coupled to a lower winding 202b, is viewed in the figure. It is understood that a second winding pair (and more according to some embodiments) is below the plane of the figure. In some embodiments, upper winding 202a and lower winding 202b extend through first portion 104a of magnetic core block 104 and into package dielectric 101. Vias interconnects 203 are within package dielectric 101, allowing signal-carrying routing to remain outside of magnetic core block 104. Vertical separation between each winding is equivalent to the thickness h of one or more package dielectric film layers, which determines the distance between conductor layers (e.g., the vertical separation between conductor layers N−6 and N−5 or higher conductor levels). In some embodiments, h may be equal to two or more combined dielectric film thicknesses.

The general description of structural features and composition for magnetic core block 104 and multi-turn inductor 201 (or 105) are substantially the same as the description given above (see above description of magnetic core block 104 and multi-turn inductor 201 related to FIGS. 2A and 2B). Multi-turn inductors 105 extend along the length of magnetic core block 104 in the y-direction. Multi-turn inductors 201 or 105 are further characterized by an inter-level z-height that is at least the indicated vertical distance h between conductor levels N−6 and N−5. In some embodiments, h is substantially equal to the thickness of a layer of package dielectric laminate.

Arrows indicate an example of current flow in multi-turn inductor 201 or 105 shown in FIG. 1C. In some embodiments, multi-turn inductor 201 is coupled to pads/traces 103 in conductor layer N−4 by vias 203. Pads/traces 103 are coupled to vias similar to vias 102 in FIG. 2B, embedded in package dielectric 101 in a complete package substrate 200. As an example, multi-turn inductor 201 is coupled to an IVR circuit on a microprocessor die (not shown) that is attached to package substrate 200.

FIGS. 3A-3M illustrate an exemplary method for making a package substrate-integrated multi-turn inductor 201, according to some embodiments of the disclosure.

Figure 3A:
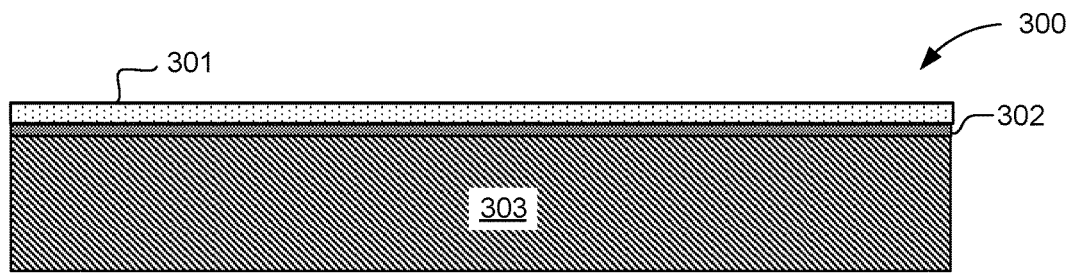
FIGS. 3A-3M illustrate an exemplary method for making a package substrate-integrated multi-turn inductor, according to some embodiments of the disclosure.

In the operation shown in FIG. 3A, conductor layer 301 is formed over a sacrificial metal layer 302 that is overlays substrate 303 of package core panel 300. In some embodiments, package core panel substrate 303 comprises a stiff dielectric material, such as an epoxy resin fiberglass. In some embodiments, sacrificial metal layer 302 comprise copper foils adhered to at least one side of package core panel substrate 303. In some embodiments, sacrificial metal layer 302 is on both sides of package core panel substrate 303. In some embodiments, conductor layer 301 is formed by electroplating methods, and comprises any of copper, silver, gold, nickel, cobalt or tungsten. In some embodiments, conductor layer 301 has a thickness ranging between 15 microns and 35 microns.

Figure 3B:
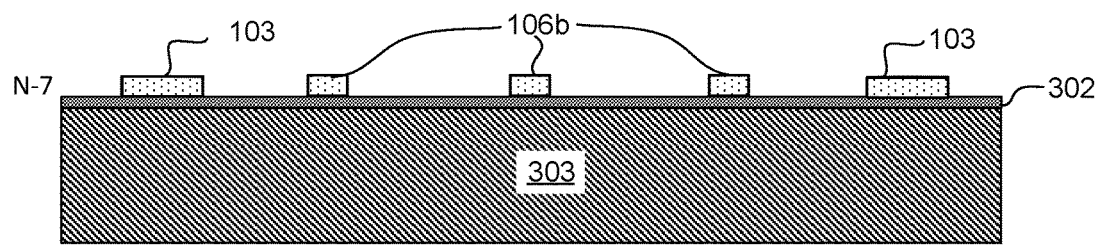

In the operation shown in FIG. 3B, conductor layer 301 is patterned to form pads/traces 103 and lower windings 106b. Patterning may be performed by lithographically defining features such as pads and traces. Lithographic techniques may be employed to form an etch mask from a photoresist deposited over conductor layer 301. Lower windings 106b extend along the y-direction in the figure. In some embodiments, the etch mask is formed from a dry film resist laminated over package core panel 300. In some embodiments, the etch mask is formed from a photoresist that is deposited by spin coating methods. Conductor layer 301 may be etched by a variety of suitable etching methods. As an example, an etchant comprising iodide ions and iodine may be employed to etch copper. In subsequent steps, the etch mask is removed by a suitable photoresist stripping method.

Figure 3C:
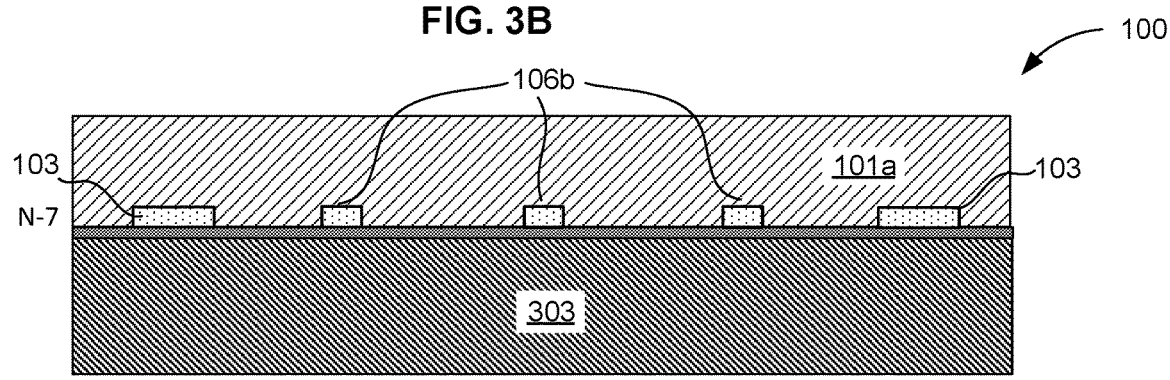

In the operation shown in FIG. 3C, first dielectric film 101a is laminated over conductive structures (e.g., pads/traces 103 and lower windings 106b) on package substrate core panel 303. First dielectric film 101a may be the first of several dielectric laminate films to build up the package substrate 100. Dielectric laminates may comprise epoxies, polyimides and polyamides, as well as liquid crystalline polymers, and are applied as flexible sheets that are laminated over stiff core materials such as package core panel substrate 303. Lamination may be performed at elevated temperatures on a lamination machine to form a conformal layer over pads/traces 103 and lower windings 106b.

Figure 3D:
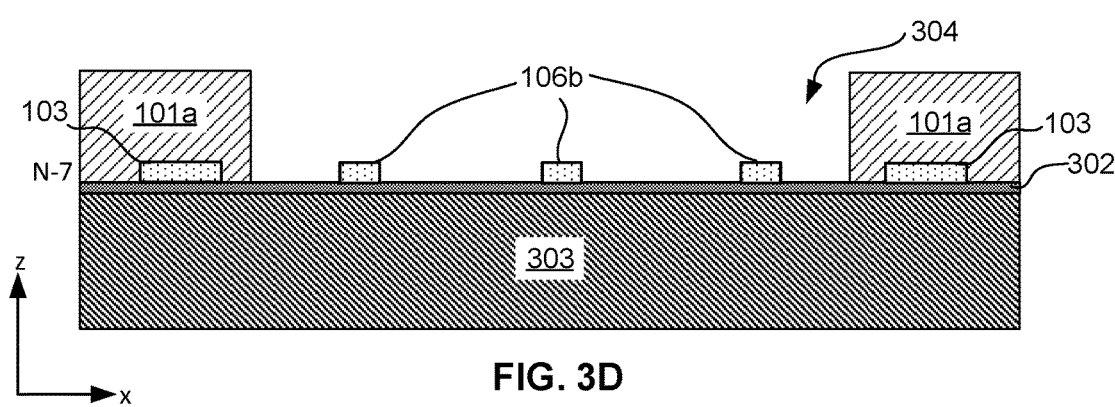

In the operation shown in FIG. 3D, cavity 304 is formed in first dielectric film 101a in preparation for formation of a magnetic core block (e.g., magnetic core block 104). In some embodiments, cavity 304 is formed by drilling into first dielectric film 101a by a method of overlap drilling. In some embodiments, laser drilling is employed in the overlap method. Sacrificial metal layer 302 may act as a laser stop to prevent damage to package core panel substrate 303. In some embodiments, cavity 304 has dimensions of ranging between 500 microns to 2000 microns in the x and y directions. In some embodiments, cavity 304 has a z-height that is the same as the thickness of first dielectric layer 101a, which has a thickness that ranges between 20 microns to 60 microns.

Figure 3E:
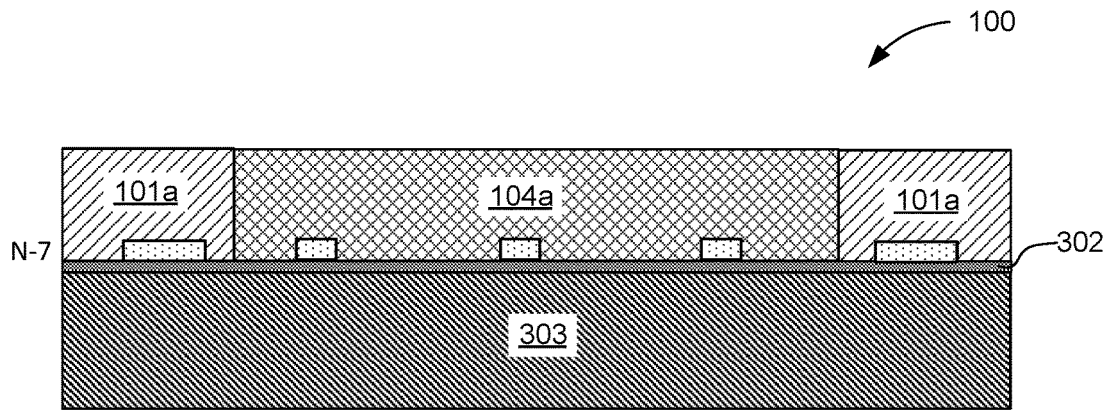

In the operation shown in FIG. 3E, cavity 304 is backfilled with a first magnetic material to form magnetic core block first portion 104a, embedded in first dielectric film layer 101a. In some embodiments, first magnetic material comprises a finely divided powder of magnetic or magnetizable material, such as those disclosed above (e.g., see description relating to FIG. 1A) mixed in a polymeric or an inorganic matrix. In some embodiments, the matrix comprises a curable epoxy resin. In some embodiments, the matrix is cured by a thermal treatment. In some embodiments, the matrix is cured by exposure to light (e.g., ultraviolet).

In some embodiments, uncured magnetic material is backfilled into cavity 304 as a paste. The paste may be dispensed through nozzles of a dispensing device, then cured.

Figure 3F:
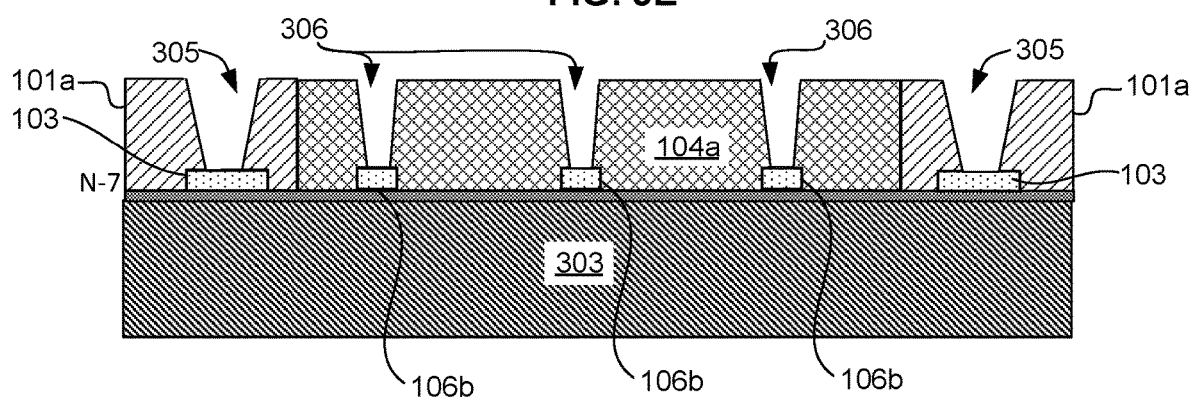

In the operation shown in FIG. 3F, vias openings 305 are formed in package dielectric 101a over pads/traces 103, which are exposed at the bottom of the vias, for formation of signal vias that are to be electroplated in a subsequent operation. Via openings 306 are formed in magnetic core block first portion 104a. In some embodiments, laser drilling is employed to form via openings 305 and 306. Via openings 305 and 306 may have dimensions ranging between 10 and 200 microns in diameter. In some embodiments, via openings 305 and 306 are drilled in a single step by laser drilling. Pads/traces 103 and lower windings 106b may perform as laser stops to prevent damage to underlying layers. Pads/traces 103 and lower windings 106b may be coupled to a power source for electroplating of vias in a subsequent operation.

Figure 3G:
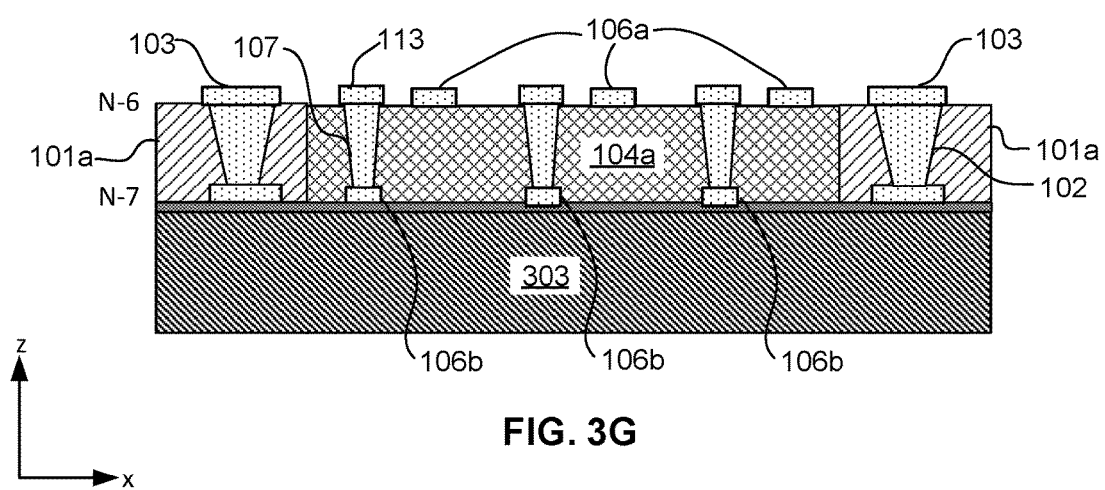

In the operation shown in FIG. 3G, vias 102 and 107 (e.g., interconnect vias 107 in FIGS. 1A-1C) are electroplated into via openings 305 and 306 over pads/traces 103 and at one end of lower windings 106b, respectively. Pads/traces 103 and lower windings 106b are in conductor level N−7, forming pairs of interconnect pads and/or traces that are to be associated with each multi-turn inductor (e.g., multi-turn inductors 105 in FIGS. 1A-1C). Pads/traces 103a and upper windings 106a may be coupled to a power source and provide electrodes for electroplating of the vias. Plated materials may include any of copper, nickel, gold, silver, tungsten or cobalt. In some embodiments, electroplating is performed until vias 102 and 107 fill the openings 305 and 306, respectively, reaching the top surface of first dielectric layer film 101a. In some embodiments, plating continues to form a second conductor layer (not shown) over the surface of first dielectric layer film 101a and magnetic core block first portion 104a, corresponding to conductor layer N−6 in FIGS. 1A-1C.

In some embodiments, a conductive seed layer is deposited over the surface of first dielectric film layer 101a and magnetic core block first portion 104a. Seed layer formation comprises deposition of any suitable conductive film, including, but not limited to, a film comprising copper, gold, silver, nickel, tungsten or molybdenum. In some embodiments, a seed layer may also be formed by electroless metal deposition techniques. Other seed layer deposition methods include, but are not limited to, evaporation, sputtering and chemical vapor deposition.

The second conductor layer is patterned to form upper windings 106a and pads/traces 103 and 113. The prime designation indicates pads or traces within magnetic core block first portion 104a. Pads/traces 103 are generally formed over the package dielectric material (e.g., dielectric film layer 101a). In some embodiments, upper windings 106a are traces that extend in the y-direction, above and below the plane of the figure. In some embodiments, upper windings 106a are substantially parallel to lower windings 106b. In some embodiments, pads/traces 103, 113 and upper windings 106a have thicknesses that range between 15 microns and 35 microns. Pads/traces 113 are integral with interconnect vias 107.

The same lithographic etch process that was used to pattern the first conductor layer (e.g., first conductor layer in FIG. 3A) may be employed to pattern the second conductor (not shown). Subsequent to formation of pads/traces 103 in conductor level N−6 is lamination of second dielectric film layer 101b (not shown in FIG. 3G). As with first dielectric film layer 101a, second dielectric film layer 101b is conformal over structures in conductor layer N−6.

Figure 3H:
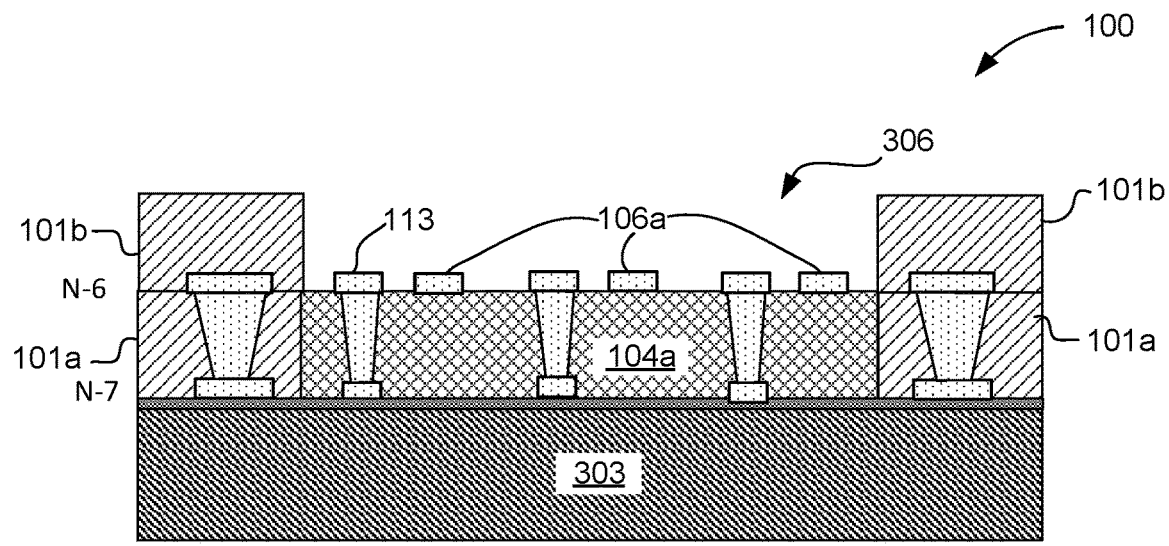

In the operation shown in FIG. 3H, a second dielectric film layer (e.g., dielectric film layer 101b) is laminated over conductor level N−6, comprising pads/traces 103, 113 and upper windings 106a. Subsequent to the lamination of second dielectric film layer 101b, second cavity 306 is formed over the top of magnetic core block first portion 104a. In some embodiments, second cavity 306 is formed by overlap laser drilling, as described for formation of the first cavity (e.g., cavity 304 in FIG. 3D). In some embodiments, cavity 306 is drilled to a depth corresponding to conductor level N−6. At this level, upper windings 106a and pads/traces 113 are uncovered. In general, the laser drilling method does not damage metal structures such as upper windings 106a and pads/traces 113. Laser penetration below conductor level N−6 may excavate some of magnetic material below, but any damage will be repaired by a second backfill, as described in the next operation.

Figure 3I:
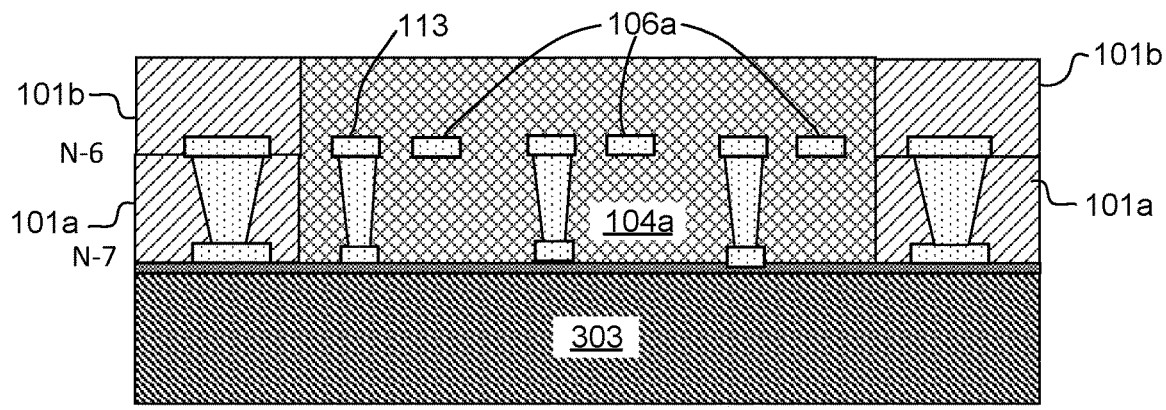

In the operation shown in FIG. 3I, second cavity 306 is backfilled with magnetic material to raise the z-height of magnetic core block first portion 104a to the top of second dielectric film layer 101b, fully embedding lower windings 106b within magnetic core block first portion 104a. Maintaining a portion of the magnetic core block elevated above the multi-turn inductor (e.g., multi-turn inductor 201) permits flux concentration within the core block, minimizing leakage flux from extending into the package dielectric. This geometry also increases the inductance density of the inductor structure. A variety of suitable methods may be employed to backfill the magnetic material, such as dispensing a curable magnetic paste, as described for FIG. 3E. In some embodiments, the second backfill material is deposited by the same method as that employed for depositing the first backfill material in FIG. 3E.

Figure 3J:
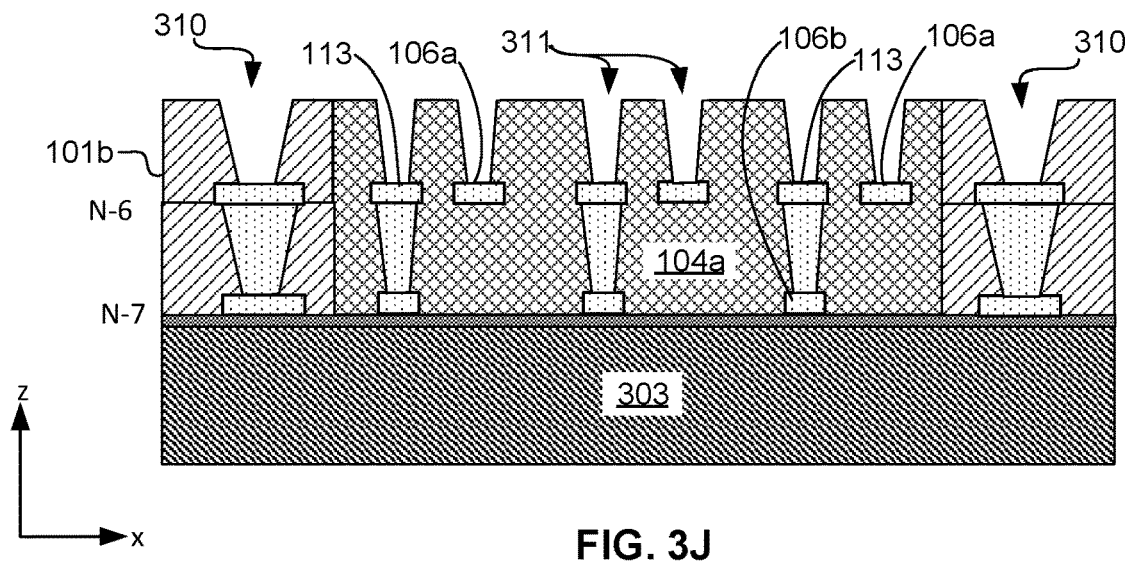

In the operation shown in FIG. 3J, via openings 310 and 311 are formed in second dielectric film layer 101b and magnetic film block first portion 104a, respectively. Vias openings are made over pads/traces 103 and at ends of upper windings 106a in conductor level N−6, uncovering portions of these structures. In some embodiments, via openings are formed in the manner described for FIG. 3F.

Figure 3K:
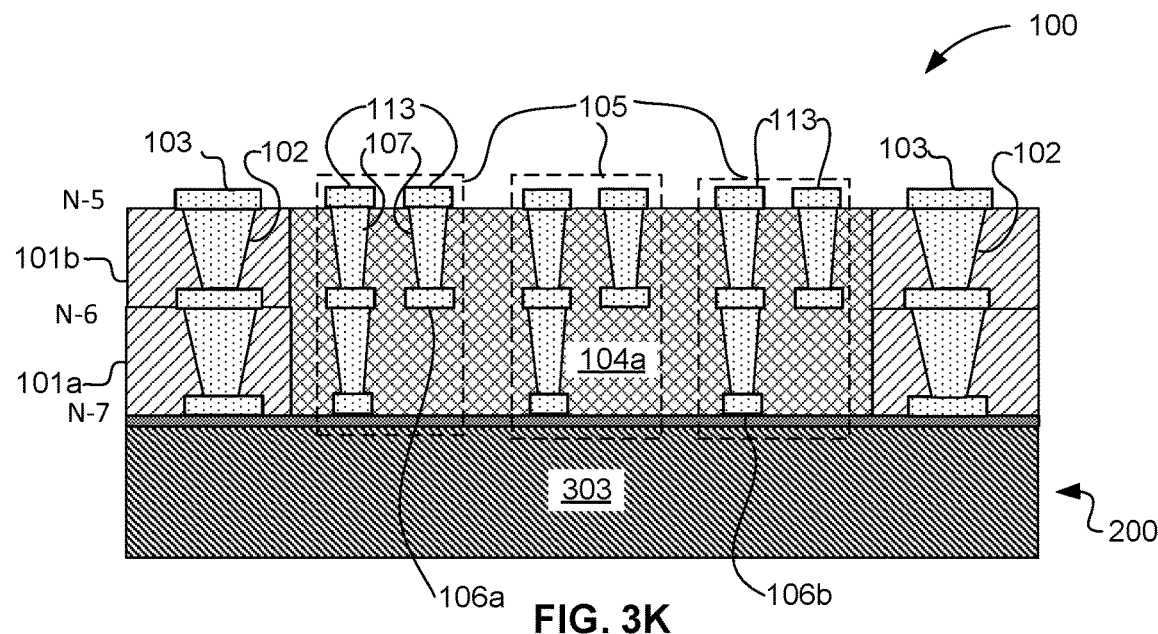

In the operation shown in FIG. 3K, vias 102 and 107 are formed in via openings 310 and 311, respectively, over N−6 level pads/traces 103. Vias 102 extend through dielectric film layer 101b, and vias 107 extend through magnetic material in the upper region of magnetic core block first portion 104a between conductor levels N−6 and N−5. In some embodiments, a third conductor layer (not shown) is formed during deposition of vias 102 and 107, and patterned to form pads/traces 103, 113 and upper windings 106a in level N−5.

Pads/traces 103 are formed over vias 102. Pads/traces 113 are formed over interconnect vias 107. Pads/traces 113 are coupled to lower windings 106b by interconnect vias 107. Upper windings 106a are coupled to lower windings 106b by interconnect vias (e.g., interconnect vias 107) that are out of the plane of the figure (see FIG. 1B). In some embodiments, when vias 102 and 107 reach the top of via openings 307 and 308 during electroplating, electroplated metal flows laterally over adjacent surface, forming mushroom-shaped pads over vias 102 and adjacent surface of second dielectric film layer 101b.

The formation of vias 102 and 107 between conductor levels N−6 an N−5, as well as the formation of pads/traces 103, complete fabrication of metal structures of multi-turn inductors 105. Inductors 105 formed by the exemplary process are delineated by the dashed rectangles enclosed around three adjacent inductors.

Figure 3L:
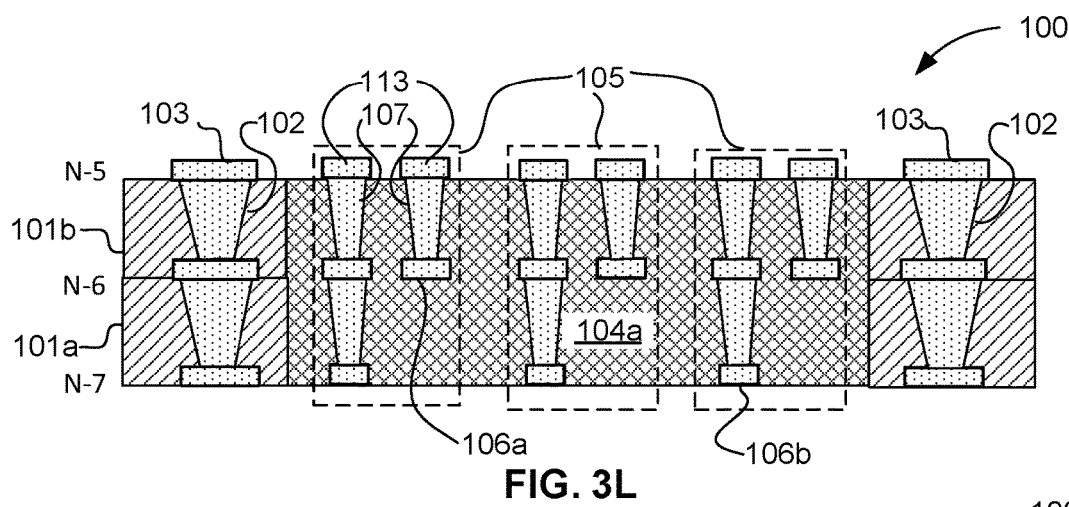

In the operation shown in FIG. 3L, nascent package substrate 100 is de-paneled by removal of package substrate panel 200 package substrate 100. In some embodiments, package core panel 200 may be removed by mechanical or chemical attack on sacrificial metal layer 202.

In the operation shown in FIG. 3M, second portion 104b of magnetic core block 104 is deposited below first portion 104a. In some embodiments second portion 104b extends below the bottom side of package substrate 100. In some embodiments, second portion 104b is deposited by an ink-jet printing process. In some embodiments, second portion 104b comprises substantially the same magnetic material that is comprises by first portion 104a. In some embodiments, second portion comprises a polymeric matrix that has a lower viscosity in the uncured precursor state than the precursor matrix of first portion 104a, to facilitate printing of the material. In some embodiments, a solder mask is deposited and patterned in an operation preceding the deposition of second portion 104b, to form solder ball pockets over traces/pads 103 in conductor level N−7.

Subsequent to the formation of multi-turn inductor 201, build-up of the nascent package substrate 100 may be continued to complete the package embodiment shown in FIGS. 1A-1C.

Figure 3M:
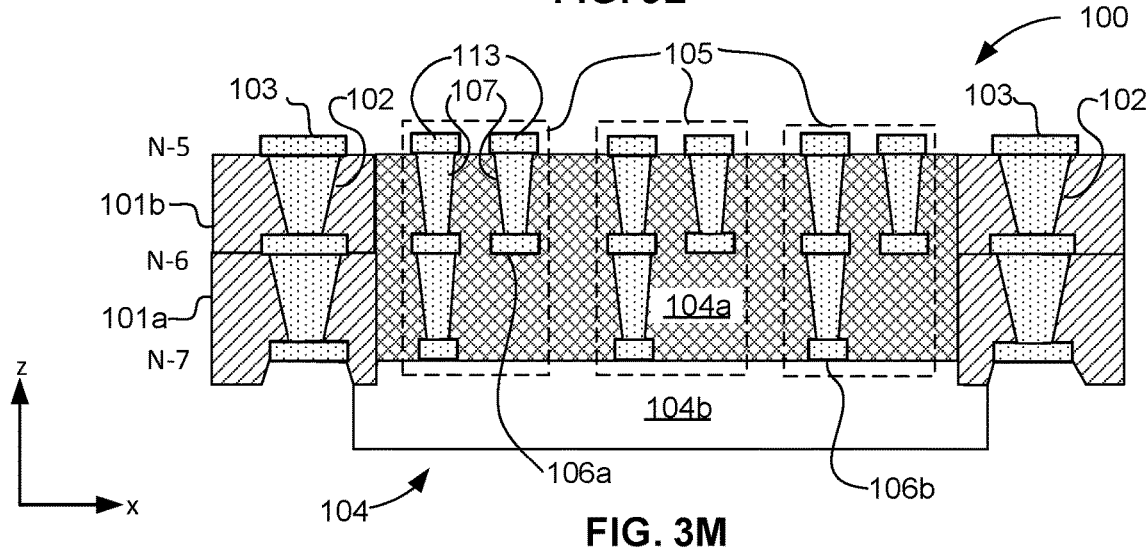
Figure 4A:
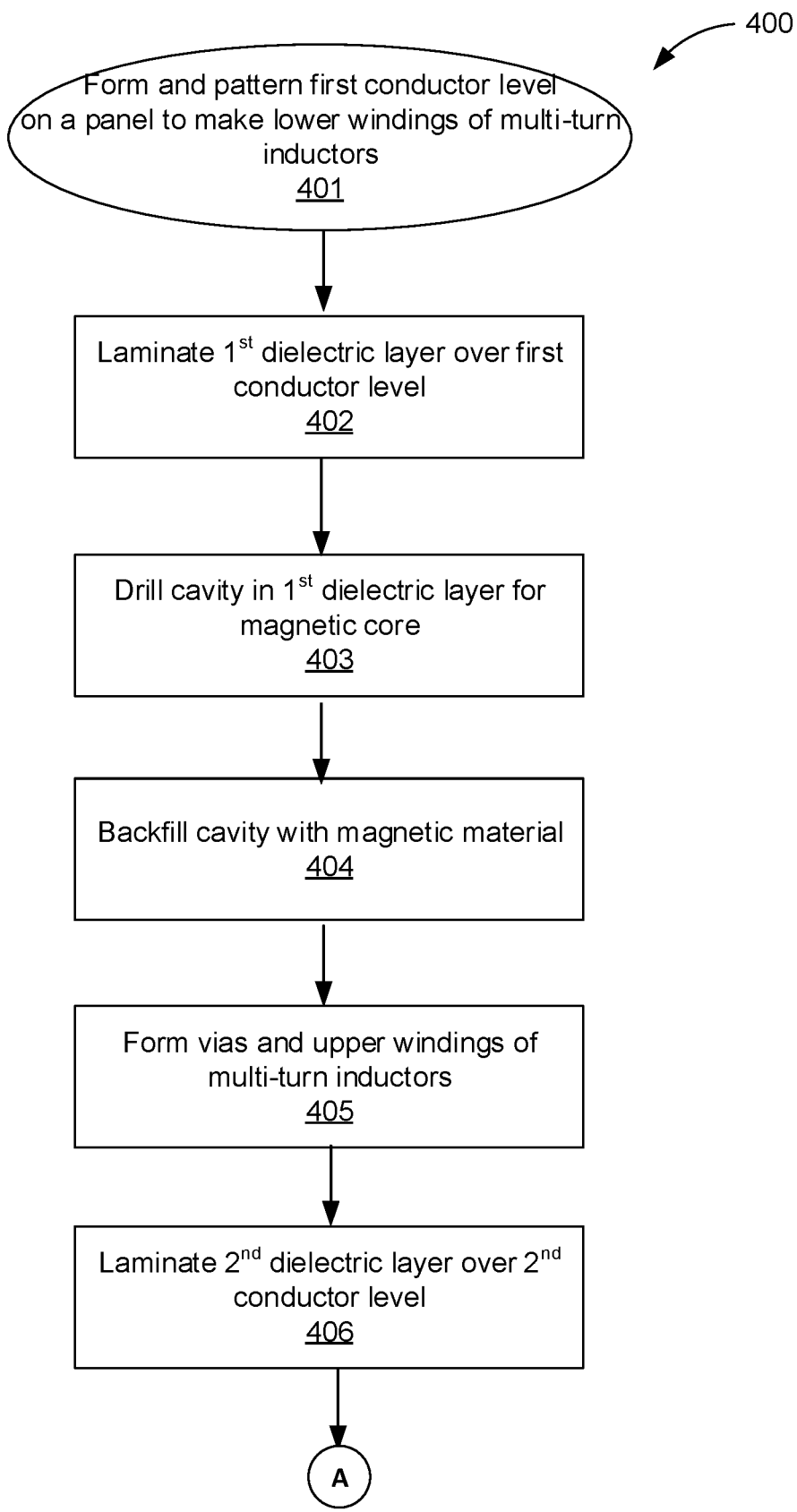
FIGS. 4A-4B illustrate a flow chart summarizing the exemplary method shown in detail in FIGS. 3A-3M, according to some embodiments of the disclosure.
Figure 4B:
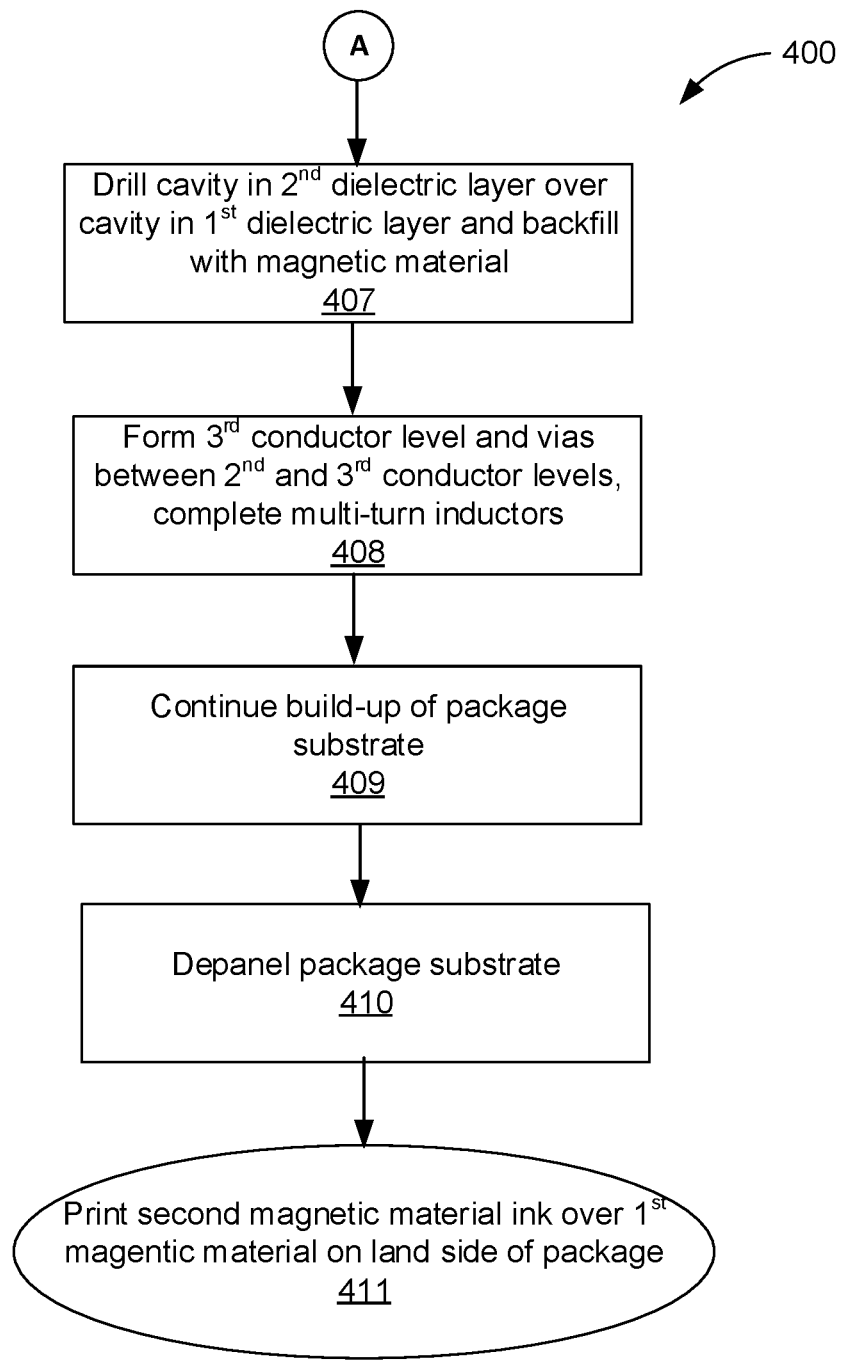

FIGS. 4A-4B illustrate flow chart 400 summarizing the exemplary method shown in detail in FIGS. 3A-3M, according to some embodiments of the disclosure.

At operation 401, a package substrate panel is received having a sacrificial metal layers on at least one side of the panel substrate. (e.g., copper foils on package substrate panel 200 in FIG. 3A). A first package conductor level is electroplated over the sacrificial metal layer(s) on one or both sides of the panel substrate to a thickness ranging between 15 microns to 35 microns. Lithographically-defined metal features, such as pads/traces 103 and lower windings 106b (see FIG. 3B) are patterned in the first conductor level (e.g., conductor level N−7 in FIG. 1A).

At operation 402, a first dielectric film layer (e.g., first dielectric film layer 101a in FIG. 3C) is laminated over the first conductor level to form the first dielectric layer of a build-up package substrate (e.g., nascent package substrate 100). The first dielectric film layer is a conformal layer so that no gaps are present between the dielectric and metallization features.

At operation 403, a cavity (e.g., cavity 304 in FIG. 3D) is formed in the first dielectric film layer. The cavity is made in preparation for the formation of an embedded magnetic core block. The drilling operation may be performed by a variety of methods, including drilling by optical (e.g., laser) or mechanical means. In some embodiments, a suitable wet or dry etch method is employed to fabricate the cavity. In some embodiments, the cavity is formed by laser drilling, where a laser beam drills into the dielectric layer to the metal layers, which act as a laser stop. Dry and wet etching methods may require lithographically-defined masks. Drilling methods may have a greater degree of dimensional control over etch methods, as mask undercutting may occur, which tends to enlarge etched regions and form sloped sidewalls. Mechanical drilling methods employ precision bits that form cylindrical holes with vertical sidewalls, as well as precise hole diameters.

In regards to laser drilling, the laser beam may be an infrared beam emanating from an infrared laser, such as a neodymium-doped yttrium aluminum garnet (Nd:YAG) laser. Laser drilling generally makes conical holes having a maximum diameter approximately the beam-width. The conical shape of the hole is a result of the radial gaussian energy distribution of the beam. The laser beam may then be stepped laterally by a half diameter and drill an overlapping hole. The operation may be repeated in both lateral dimensions (e.g., x and y directions) until the cavity is made to the predetermined dimensions (e.g., 500 to 2000 microns).

At operation 404, the cavity is backfilled with magnetic material to form a portion of the magnetic core block (e.g., first portion 104a in FIG. 3E). In some embodiments, the magnetic material comprises a finely-divided powder of a magnetic material or magnetizable material suspended in a non-magnetic matrix material. In some embodiments, the matrix is a one of a polymer, an inorganic material, or a composite). In various embodiments, the polymer matrix comprises a curable epoxy resin. The polymer matrix is in a liquid precursor state, where the polymer (e.g., an epoxy) is not crosslinked. The viscosity of the polymer matrix is adjustable for optimize deposition, and depends on the polymer chain lengths, degree of crosslinking in the precursor state, and the size and concentration of magnetic particles.

The magnetic material may be deposited within the cavity as a curable paste and is solidified by a thermal or optical treatment.

At operation 405, vias (e.g., interconnect vias 107) are formed in via openings made in the magnetic core block (e.g., see FIGS. 3F and 3G), in preparation for the formation of vertical interconnects between upper and lower windings (e.g., windings 106 in FIGS. 1A-1C) within the magnetic core block. Interconnect vias within the magnetic core also provide interconnections between conductor layers to carry signals to and from the multi-turn inductors that are to be formed. In some embodiments, the vias are formed by laser drilling. Via openings are drilled down to the first conductor level (e.g., conductor level N−7) in order to access metallization features (e.g., pad/traces 113 and lower windings 106b in FIG. 3F). The metal structures in conductor level N−7 may be coupled to a power source for electroplating metal into the via openings. Via openings outside of the magnetic core block are made simultaneously in the first dielectric layer (e.g., dielectric film layer 101a, FIGS. 3F and 3G) for electroplating via interconnects (e.g., vias 102)

for vertical conveyance of power or data signals that are not routed through the inductors (e.g., multi-turn inductors 105).

In some embodiments, a seed layer is deposited over the dielectric to enhance electroplating. In addition to vias, a second conductor level is electroplated over the dielectric and patterned.

At operation 406, a second dielectric layer (e.g., dielectric film layer 101*b* in FIG. 3H) is laminated over the second conductor level (e.g., conductor level N−6). The second dielectric layer is laminated conformally over metallization features of the second conductor level.

At operation 407, a cavity (e.g., cavity 306 in FIG. 3H) is drilled in the second dielectric layer over the first portion of the magnetic core block (see FIG. 3H). The cavity is backfilled with magnetic material that is substantially the same as the magnetic material in the magnetic core block as shown in FIG. 3I. The backfill in the cavity in the second dielectric layer fully embeds the trench inductor within the magnetic core. The headspace of magnetic core over the trench inductor concentrates magnetic flux close to the trench inductor, and may reduce leakage flux from coupling with other conductors within the package.

At operation 408, a third conductor level (e.g., conductor level N−5 in FIG. 3K) is formed over the second dielectric layer and the magnetic core block and patterned to form pads and traces. In some embodiments, the third conductor level is formed by electrodeposition over a seed layer, and patterned by a lithographically-defined etch process. At this point in the process flow, fabrication of the metal structures of multi-turn inductors (e.g., multi-turn inductors 105 in FIG. 3K) is completed.

At operation 409, fabrication of the package substrate is continued. A continued series of package build-up operations may be executed. In these build-up operations, dielectric layers are laminated, and higher conductor levels (e.g., conductor levels N−3 through N) are formed.

At operation 410, the package substrate is removed (de-paneled) from the package substrate panel (e.g., see FIG. 3L). In some embodiments, the panel (e.g., package substrate panel 200 in FIG. 3K) is de-paneled by mechanical or chemical detachment of the sacrificial copper foils. The sacrificial metal layers may be etched off of the separated package substrate by an etch process that targets the sacrificial layers, and avoids etching the lower-most (land side) conductor level (e.g., conductor level N−7).

At operation 411, a second portion of magnetic core block (e.g., second portion 104*b* of magnetic core block 104) is formed by depositing a magnetic material over the first portion (e.g., first portion 104*a* of magnetic core block 104) of the magnetic core block (e.g., magnetic core block 104 in FIG. 3M). In some embodiments, the second portion of the magnetic core block is formed on the land side of the package substrate, below the first portion 104*a* of magnetic core block 104 that was previously formed in the cavity and embedded in the package dielectric.

In some embodiments, the second portion (e.g., second portion 104*b* of magnetic core block 104) is deposited by a printing process, such as ink jet printing over the first portion of the magnetic core block. In some embodiments, the magnetic material extends below conductor level N−7 over the land side of the package substrate, and not embedded within the package dielectric. In some embodiments, the second portion of the magnetic core block is at least partially embedded with the package dielectric.

In some embodiments, the magnetic material comprised by the second portion is substantially the same as the magnetic material comprised by the embedded first portion.

In some embodiments, the magnetic material of the second portion comprises a matrix that is substantially different from the matrix of the first portion. As an example, the matrix material may be a liquid polymer that has a lower viscosity (compared to a magnetic paste) to enable printing of the material.

Figure 5:
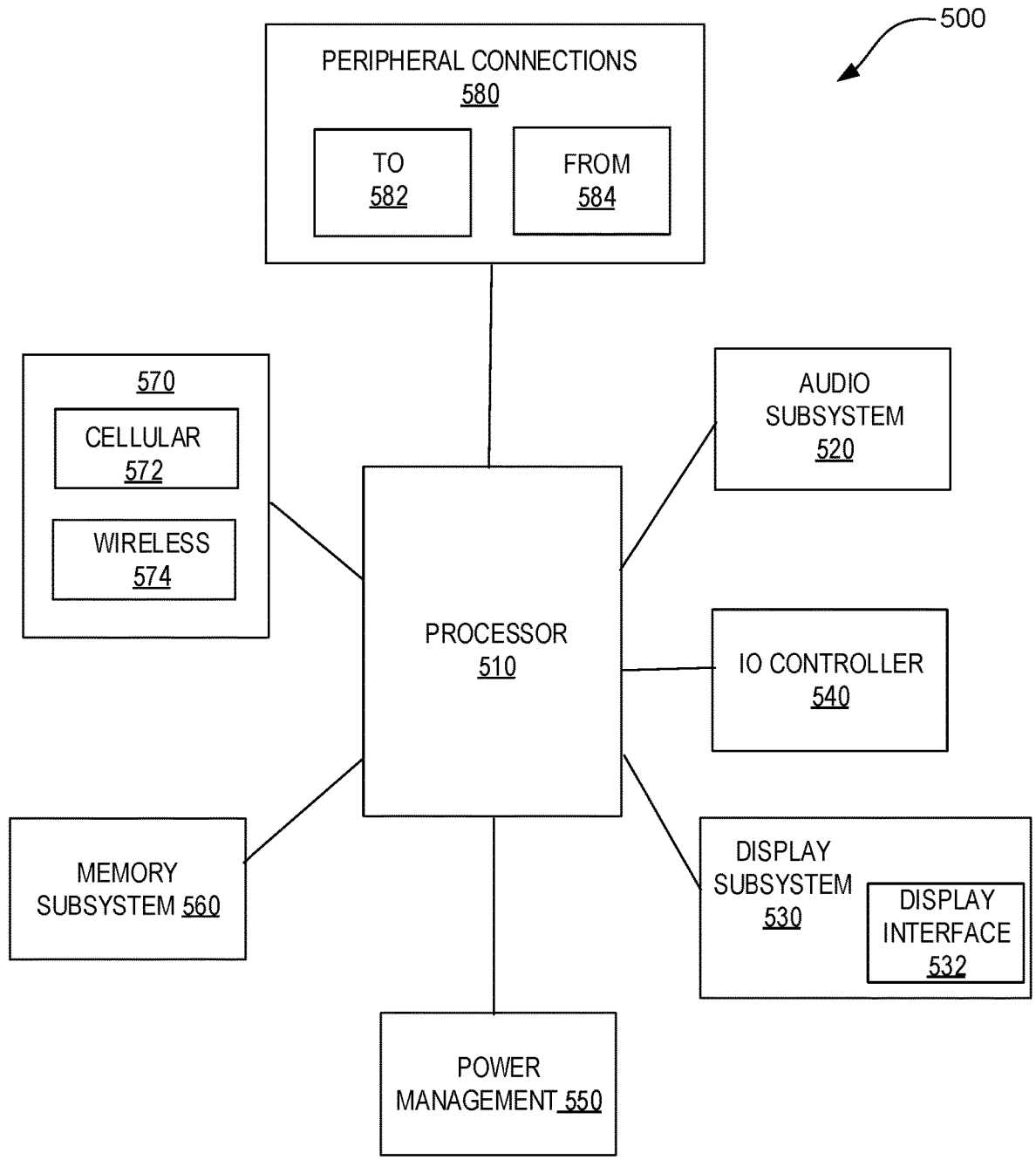
FIG. 5 illustrates a package having integrated multi-turn inductors, fabricated according to the disclosed method, as part of a system-on-chip (SoC) package in an implementation of computing device, according to some embodiments of the disclosure.

FIG. 5 illustrates a package having integrated multi-turn inductors (e.g., multi-turn inductors 105 or 201) fabricated according to the disclosed method, as part of a system-on-chip (SoC) package in an implementation of computing device, according to some embodiments of the disclosure.

FIG. 5 illustrates a block diagram of an embodiment of a mobile device in which integrated inductors could be used. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500.

In some embodiments, computing device 500 includes a first processor 510 that comprises at least one FIVR coupled to the multi-turn inductors within a magnetic core block integrated in the package substrate. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532 which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Network interface 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package, comprising:
 a magnetic material at least partially within a dielectric material;
 a first trace at least partially within the magnetic material;
 a second trace at least partially within the magnetic material; and
 a via interconnect coupling together the first trace and the second trace.

2. The IC package of claim 1, wherein a first length of the first trace within the magnetic material is substantially parallel to a second length of the second trace within the magnetic material.

3. The IC package of claim 2, wherein the first length of the first trace within the magnetic material is laterally offset from the second length of the second trace within the magnetic material.

4. The IC package of claim 1, wherein the via interconnect is within the dielectric material, beyond an edge of the magnetic material.

5. The IC package of claim 2, wherein the first length of the first trace is coupled to the via interconnect by another length of the first trace that is non-parallel to the first length.

6. The IC package of claim 1, wherein the magnetic material comprises a first portion within the dielectric material, and a second portion over the dielectric material, and wherein the first portion comprises a first magnetic material, and the second portion comprises a second magnetic material.

7. The IC package of claim 6, wherein the first magnetic material and the second magnetic material comprise magnetic particles within a polymer matrix.

8. The IC package of claim 7, wherein the magnetic particles comprise at least one of iron, nickel, or cobalt, and wherein the polymer matrix comprises an epoxy resin or an acrylic resin.

9. The IC package of claim 1, wherein the first trace is one of two or more traces in a first conductor layer extending at least partially within the magnetic material, and the second trace is one of two or more traces in a second conductor layer extending at least partially within the magnetic material, and wherein ones of the two or more traces in the first conductor layer are coupled to ones of the two or more traces in the second conductor layer by a via within the magnetic material.

10. The IC package of claim 9, wherein the two or more traces in each of the first and second conductor layers are substantially parallel over their lengths within the magnetic material.

11. A system comprising
 the IC package of claim 1; and
 an IC die, wherein the IC die is electrically coupled to the first and second trace.

12. The system of claim 11, wherein the first and second trace are segments of an inductor, having an inductance of at least 5 nanohenries when measured at 140 MHz.

13. The system of claim 12, wherein the IC die comprises microprocessor circuitry and at least one integrated voltage regulator circuit coupled to the inductor.

14. The system of claim 13, wherein:
 the microprocessor circuitry comprises two or more integrated voltage regulator circuits;
 the IC package comprises two or more inductors, wherein the ones of the two or more inductors comprise pairs of parallel, but laterally offset traces at least partially within the magnetic material; and
 the ones of the two or more integrated voltage regulator circuits are coupled to the ones of the two or more inductors.

15. The system of claim 11, wherein the IC die comprises any one of a radio frequency amplifier circuit, a radio frequency oscillator circuit, a radio frequency phasing circuit, or a radio frequency mixing circuit.

* * * * *